(12) United States Patent
Edelstein et al.

(10) Patent No.: US 9,773,737 B2
(45) Date of Patent: Sep. 26, 2017

(54) ADVANCED METALLIZATION FOR DAMAGE REPAIR

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/949,815

(22) Filed: Nov. 23, 2015

(65) Prior Publication Data

US 2017/0148740 A1    May 25, 2017

(51) Int. Cl.
*H01L 23/532* (2006.01)
*H01L 21/768* (2006.01)
*H01L 21/02* (2006.01)
*H01L 23/58* (2006.01)
*H01L 23/522* (2006.01)

(52) U.S. Cl.
CPC .. *H01L 23/53266* (2013.01); *H01L 21/02175* (2013.01); *H01L 21/76829* (2013.01); *H01L 23/5226* (2013.01); *H01L 23/58* (2013.01)

(58) Field of Classification Search
CPC ......... H01L 2924/00; H01L 2924/0002; H01L 2924/00014; H01L 2224/32225; H01L 2224/48227; H01L 27/14687; H01L 27/14692
See application file for complete search history.

(56) References Cited

U.S. PATENT DOCUMENTS

| | | | |
|---|---|---|---|
| 5,434,451 A | 7/1995 | Dalal et al. | |
| 5,654,234 A | 8/1997 | Shih et al. | |
| 5,861,671 A | 1/1999 | Tsai et al. | |
| 6,372,638 B1 | 4/2002 | Rodriguez et al. | |
| 7,419,847 B2 | 9/2008 | Kim | |
| 2009/0230555 A1 | 9/2009 | Chapple-Sokol et al. | |
| 2010/0224876 A1 | 9/2010 | Zhu | |
| 2013/0043591 A1* | 2/2013 | Yang ................. | H01L 21/76838 257/751 |
| 2015/0069620 A1 | 3/2015 | Chi | |

FOREIGN PATENT DOCUMENTS

KR    1020060075748 A    7/2006
TW       508638 B    11/2002

OTHER PUBLICATIONS

List of IBM Patents or Patent Applications Treated As Related.

* cited by examiner

*Primary Examiner* — Tony Tran
(74) *Attorney, Agent, or Firm* — Jeffrey S LaBaw; Steven J Meyers

(57) ABSTRACT

An electrical contact structure for an integrated circuit device is described. A first patterned dielectric layer comprising at least one contact hole, the contact hole including a bottom surface, and sidewalls extending from the bottom surface to a top surface is provided. The bottom surface of the dielectric layer is in contact with a lower layer of the integrated circuit device. A tungsten via is disposed within the at least one contact hole, the tungsten via having a bottom surface in contact with the lower layer and a top surface. A tungsten nitride layer is disposed on the top surface of the tungsten via to repair etch damage done to the tungsten via.

13 Claims, 6 Drawing Sheets

ADVANCED METALLIZATION FOR DAMAGE REPAIR

BACKGROUND OF THE INVENTION

Technical Field

This disclosure relates to integrated circuit devices, and more specifically, to a structure and method for fabricating the structure where damage to a metallization layer is repaired.

Background of the Related Art

Semiconductor devices include a plurality of circuits that form an integrated circuit (IC) fabricated on a semiconductor substrate. A complex network of conductive wiring connects the circuit elements distributed on the surface of the substrate. Efficient routing of the wiring for the device requires formation of multilevel or multilayered schemes, such as, for example, single or dual damascene wiring structures. The wiring typically includes copper, Cu, or a Cu alloy since Cu-based interconnects provide higher speed signal transmission as compared with aluminum-based interconnects. Other metals such as tungsten, W, are used for specialized purposes as an interconnect. Within a typical interconnect structure, metal vias run perpendicular to the semiconductor substrate and metal lines run parallel to the semiconductor substrate.

The interconnect structure must connect electrically to the device regions defined in the semiconductor substrate. This substrate usually involves a passivating and an insulating layer required to form and isolate different device regions. Openings through these layers are filled by conductive vias to allow electrical contact to be made selectively to the underlying device regions.

In its simplest form, the opening through which a via is formed is created by first masking the insulating layer, e.g., a dielectric layer, with photoresist and then selectively etching a portion of the insulating layer. The opening formed in the photoresist using well known photolithographic techniques is etched to form an opening to the underlying device or conductive layer. Depending on the aspect ratio and the interconnection ground rules, isotropic or anisotropic etching processes may be used to form a hole in the insulating layer. Subsequent layers of lines above the via are also defined by means of a lithography and etch process. Good contact between the metal lines and vias is necessary to allow proper functioning and reliability of the integrated circuit The embodiments discussed below relate to improved structures for providing good contact between a conductive via and an overlying conductive metal lines, as well as to methods for making such structures in semiconductor devices.

BRIEF SUMMARY

According to this disclosure, an electrical contact structure for an integrated circuit device is described. A first patterned dielectric layer comprising at least one contact hole, the contact hole including a bottom surface, and sidewalls extending from the bottom surface to a top surface is provided. The bottom surface of the dielectric layer is in contact with a lower layer of the integrated circuit device. A tungsten via is disposed within the at least one contact hole, the tungsten via having a bottom surface in contact with the lower layer and a top surface. A tungsten nitride layer is disposed on the top surface of the tungsten via to repair etch damage done to the tungsten via.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
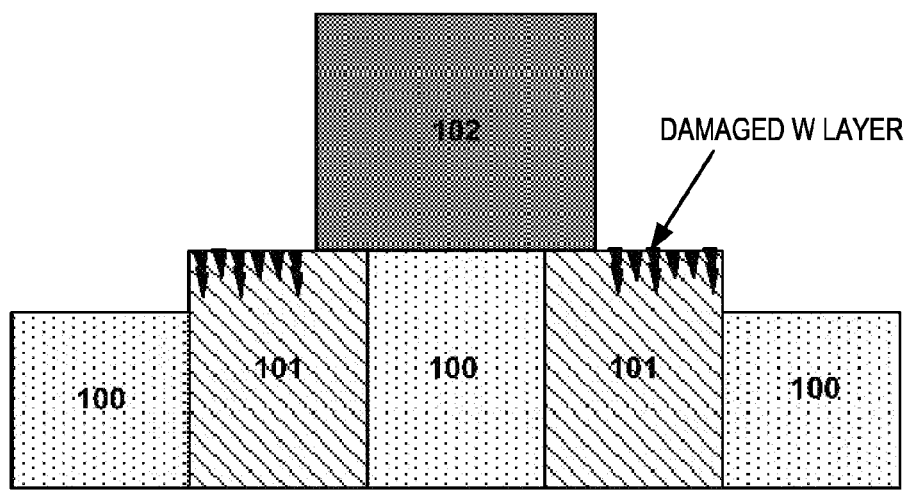
FIG. 1 is a cross-sectional diagram of a structure according to an embodiment of the invention illustrating damage to the tungsten vias.

At a high level, the present invention concerns an improved via metallization structure used for interconnecting semiconductor devices. The present invention also includes the methods for fabricating such a device. More particularly, the present invention concerns the use of nitridization to repair damage to a tungsten incurred during a prior etch step.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures. The sidewall structures can be used as masking structures for further semiconducting processing steps.

In the metallization process, the top surface of the tungsten (W) contacts or vias can be damaged during the Reactive Ion Etch (RIE) process which occurs during the first layer of wiring (M1 layer) dielectric patterning. This problem is depicted in FIG. 1 which is a cross-sectional diagram of a structure having a dielectric layer 100 with tungsten vias 101 deposited in contact holes to the device layer. The damaged tungsten layer occurs at the corners of the tungsten via which has been exposed to the RIE etch during patterning of the M1 dielectric layer 102. The damaged surface does not provide a good surface for subsequent metallization and can cause voids and other contact defects. This will affect the functioning of the device through higher resistance or other interconnect reliability problems such as electromigration (EM), and thermal cycling. The damaged interfacial adhesion will also degrade integrity of the interconnects. The invention repairs the damaged surface to improve electrical contact with the M1 layer and maintains and improves the required interfacial adhesion between tungsten and the subsequent metallization.

In alternative embodiments, the tungsten via can interconnect different levels of the device. For example, the tungsten via could have a bottom surface disposed on top of a first metallization layer and a top surface extending to a second metallization layer.

Figure 2:
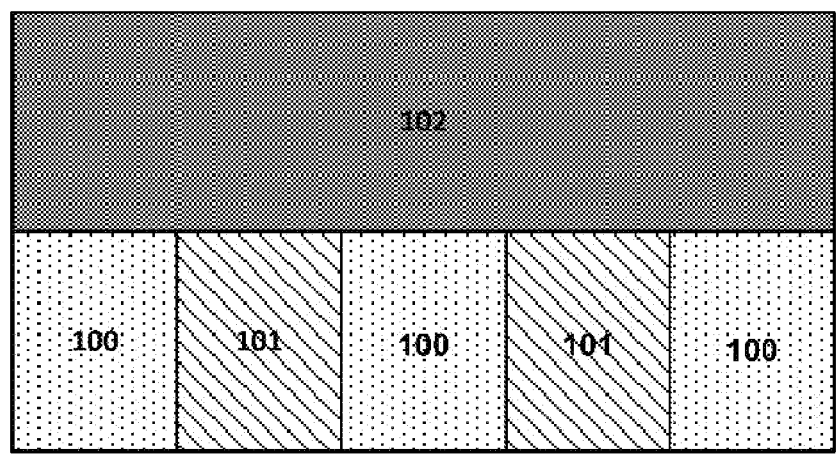
FIG. 2 is a cross-sectional diagram of a structure according to an embodiment of the invention showing an M1 dielectric layer over tungsten vias connecting to a device layer.

FIG. 2 is a cross-sectional diagram of a structure according to an embodiment of the invention showing an M1 dielectric layer 102 over tungsten vias 101 through a dielectric layer, the tungsten vias 101 connecting to a device layer below (not shown). Suitable dielectrics for the M1 dielectric layer 102 and via dielectric layer 100 include silicon dioxide (SiO2) or a low k dielectric such as carbon doped SiO2, spun-on organic or silicon based polymeric dielectrics. To fabricate this structure, via holes are etched through the via dielectric layer 100, followed by a tungsten layer deposition process. By way of example, a conformal LPCVD procedure at a temperature between 400 to 500° C. can be used to deposit the tungsten layer to a thickness between about 2000 Å to 9000 Å. The excess tungsten (i.e. over the dielectric layer 100) can be removed by a chemical mechanical polishing (CMP) step.

Figure 3:
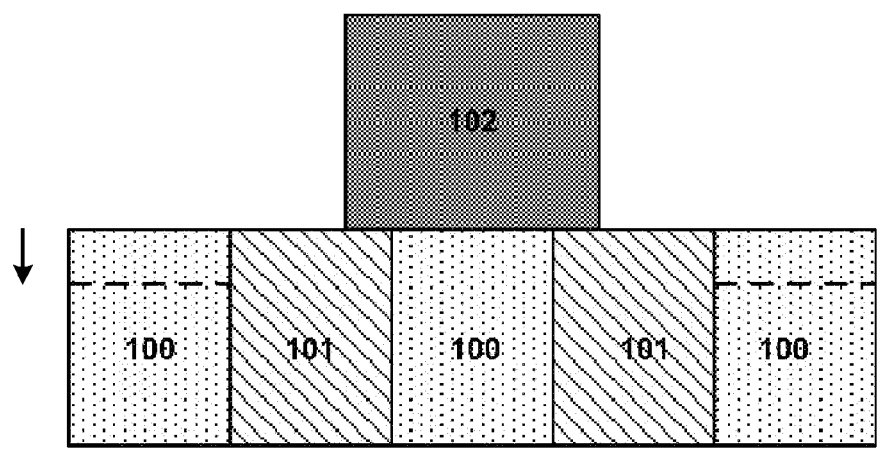
FIG. 3 is a cross-sectional diagram of a structure according to an embodiment of the invention after the M1 dielectric layer has been patterned and etched.

FIG. 3 is a cross-sectional diagram of a structure according to an embodiment of the invention after the M1 dielectric layer 102 has been patterned and etched. Also, photoresist materials have been removed from the structures after the patterning process. To ensure both physical and electrical contact with the tungsten contacts 101, an overetch into the dielectric 100 is preferred. During the overetch, the etch step thins the via dielectric layer 100 in areas outside the M1 dielectric 102 pattern area. The overetching can damage the exposed areas of the tungsten vias 101 as shown in FIG. 4 causing problems with contact with higher metallization layers.

Figure 4:
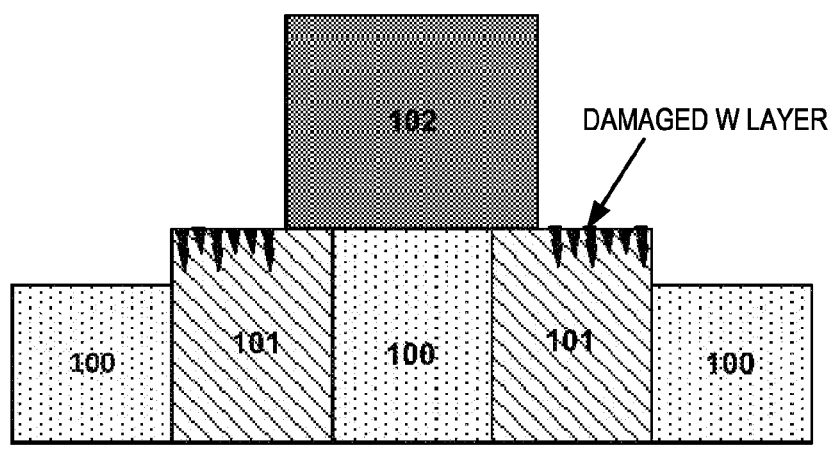
FIG. 4 is a cross-sectional diagram of a structure according to an embodiment of the invention after the field oxide dielectric layer has been etched causing damage to the tungsten vias.

FIG. 4 is a cross-sectional diagram of a structure according to an embodiment of the invention showing the damage to the tungsten vias from the M1 dielectric etch. As is mentioned above, the damage to the tungsten vias cause poor contact with subsequent layers, voids in the metallization and other problems. Both surface roughening from physical damage and surface impurities from chemical damage degrade the interfacial property between tungsten and the subsequent metallization. It is a purpose of this invention to repair the etch damage.

Figure 5:
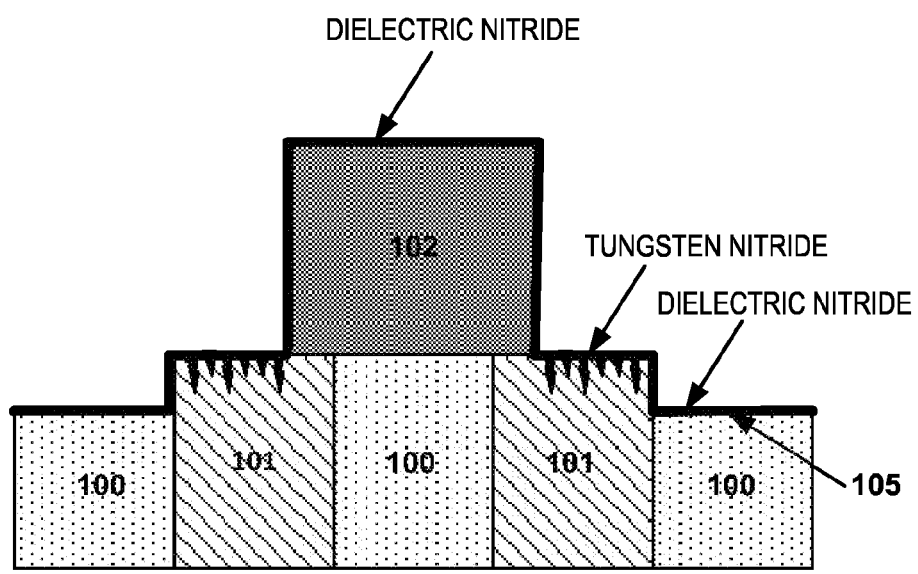
FIG. 5 is a cross-sectional diagram of a structure according to an embodiment of the invention after nitridization of the structure to repair damage to the tungsten vias.

FIG. 5 is a cross-sectional diagram of a structure according to an embodiment of the invention after nitridization of the structure to repair damage to the tungsten vias. In one embodiment of the invention, the nitridization is accomplished by a thermal nitridation process in which a nitrogen enriched dielectric surface layer 105 is formed on exposed surfaces of the dielectric material 100, 102 and a tungsten nitride layer 105 is formed over the damaged tungsten vias. The nitride layer 105 may also be referred to as a nitrided surface.

In this embodiment, the nitrogen layer 105 is formed by subjecting the structure shown in FIG. 4 to a thermal nitridation process. The thermal nitridation process employed in the present disclosure heals the damage to the tungsten vias 101 and provides a smooth and secure layer for further metallization. In the embodiment, the thermal process that is employed in the present disclosure does not include an electrical bias higher than 200 W in any nitrogen-containing gas or gas mixture. The nitrogen-containing gases that can be employed in the present disclosure include, but are not limited to, N2, NH3, NH4, NO, and NHx wherein x is between 0 and 1 or mixtures thereof. In some embodiments, the nitrogen-containing gas is used neat, i.e., non-diluted. In other embodiments, the nitrogen-containing gas can be diluted with an inert gas such as, for example, He, Ne, Ar and mixtures thereof. In some embodiments, H2 can be used to dilute the nitrogen-containing gas. The nitrogen-containing gas employed in the present disclosure is typically from 10% to 100%, with a nitrogen content within the nitrogen-containing gas from 50% to 80% being more typical. In one embodiment, the thermal nitridation process employed in the present disclosure is performed at a temperature from 50° C. to 450° C. In another embodiment, the thermal nitridation process employed in the present disclosure is performed at a temperature from 100° C. to 300° C. for 30 minutes to 5 hours. In one set of embodiments, the resulting tungsten nitride layer is between 2 angstroms to 20 angstroms thick, but alternative embodiments can have thicknesses outside this range.

In some embodiments, a N2 plasma process is used to create the nitride layer which involves an electrical bias higher than 350 W. An N2 plasma can be controlled without damaging the dielectric with ion current density range: 50~2000 uA/cm2, and process temperature between 80 and 350 degrees C.

Figure 6:
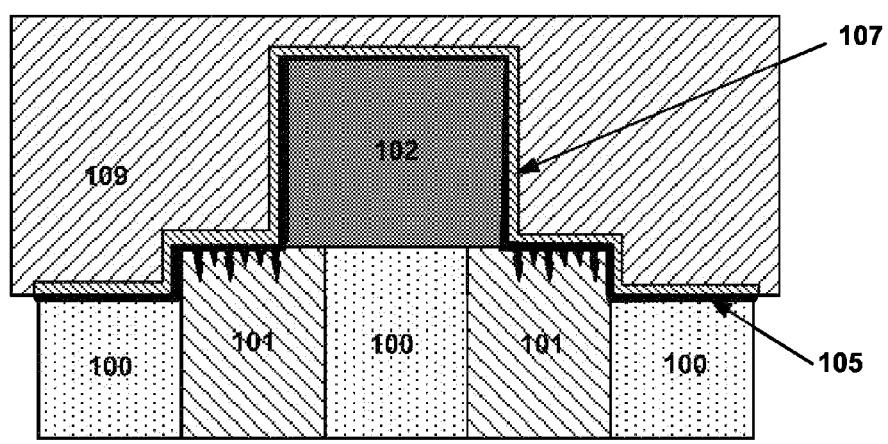
FIG. 6 is a cross-sectional diagram of a structure according to an embodiment of the invention after a liner and the M1 metal lines have been deposited.

FIG. 6 is a cross-sectional diagram of a structure according to an embodiment of the invention after a metal liner 107 and the M1 metal lines 109 have been deposited. The metal diffusion barrier liner 107 that is formed could be formed from, but is not limited to, one of the metals Ta, Ti, Ru, RuTa, Co and W. These metals will react with the underlying nitride layer 105 to form TaN, TiN, RuN, RuTaN, CoN and WN respectively. In one embodiment, Ta is employed as the material for the metal diffusion barrier liner 107. The metal liner 107 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The M1 layer 109 is formed of the first layer of conductive lines which interconnect the devices. In one embodiment, the conductive material is a conductive metal such as Cu, W or Al. In another embodiment, the conductive material comprises Cu or a Cu alloy such as AlCu. The conductive material may be formed by any conventional deposition process including chemical vapor deposition (CVD), plasma enhanced chemical vapor deposition (PECVD), atomic layer deposition (ALD) or sputtering.

As would be understood by those ordinarily skilled in the art, the foregoing structures can be formed simultaneously with other interconnect structures on the same substrate. As is mentioned above, in alternative embodiments, the tungsten via can interconnect different levels of the device.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for forming an integrated circuit comprising:
   patterning a substrate including a first contact hole and a second contact hole in a first dielectric layer, wherein the first and second contact holes include sidewalls formed of the first dielectric layer and bottom surfaces which are in contact with a lower layer of the integrated circuit;
   depositing tungsten into the first and the second contact holes forming a first tungsten via and a second tungsten via, the first and second tungsten vias having respective bottom surfaces in contact with the lower layer and respective top surfaces;

patterning a second dielectric layer over a first portion of the first dielectric layer and respective first portions of the top surfaces of the first and second tungsten vias, the patterning including an etch step which includes an overetch which damages respective second portions of the top surfaces of the first and second tungsten vias, wherein a first dielectric pattern of the patterned second dielectric layer protects the first portion of the first dielectric layer and the first portions of a top surface of the tungsten via during the etch step from the overetch, wherein the overetch reduces a height of a second unprotected portion of the first dielectric layer, wherein the patterned second dielectric layer is for a metal wire layer, wherein the first tungsten via is disposed on a first side of the first dielectric pattern and the second tungsten via is disposed on a second side of the first dielectric pattern;

generating nitrogen ions from a nitrogen containing gas;

exposing the first dielectric layer, the second dielectric layer and the second portion of the tungsten via to the nitrogen containing gas to form a nitrided surface including a nitrogen enriched dielectric surface layer over the second unprotected portion of the first dielectric layer and the second dielectric layer and a tungsten nitride repair layer over the second portion of the first and second tungsten vias which repairs the damage to the second portion of the first and second tungsten vias forming a metal diffusion barrier liner, wherein the metal diffusion barrier liner forms a continuous liner over the tungsten nitride repair layers over the first and second tungsten vias and the nitrided surface on the second unprotected portion of the first dielectric layer and the nitrided surface on the second dielectric pattern which protects the first portion of the dielectric layer; and forming a metal wire layer, wherein the metal wire layer forms a continuous layer over the first and second tungsten vias and the second dielectric pattern which protects the first portion of the dielectric layer and wherein the metal wire layer is in contact with the metal diffusion layer.

2. The method of claim 1, wherein generating the nitrogen ions from the nitrogen containing gas comprises exposing the nitrogen containing gas to an energy source effective to generate the nitrogen ions from the nitrogen containing gas.

3. The method of claim 2, wherein the energy source is a plasma energy source.

4. The method of claim 2, wherein the energy source is thermal energy source.

5. The method of claim 1, wherein portions of the nitrogen enriched dielectric surface layer are formed from a top surface of a second portion of the first dielectric layer and a top surface and a side surface of the second dielectric layer and wherein the metal diffusion liner reacts with the underlying nitride layers to form a metal nitride.

6. The method of claim 1, wherein the second dielectric layer is in direct contact with the first portion of the first and second tungsten vias.

7. The method of claim 1, wherein a bottom surface of the first dielectric layer and the bottom surface of the first and second tungsten vias are in direct contact with a device layer of the integrated circuit.

8. A method forming an electrical contact structure comprising:

providing a substrate formed of the first dielectric layer and a first and second tungsten via, the first and second tungsten vias having bottom surfaces in contact with a lower layer and a top surface;

patterning a second dielectric layer for a metal wire layer over the first dielectric layer, the patterning including an etch step which includes an overetch which damages a respective first portion of the first and second tungsten vias and reduces a height of an unprotected portion of the first dielectric layer, a first dielectric pattern of the second dielectric layer protecting a second portion of the first and second vias and a protected portion of the first dielectric layer, wherein the first tungsten via is disposed on a first side of the first dielectric pattern of the second dielectric layer and the second tungsten via is disposed on a second side of the first dielectric pattern of the second dielectric layer;

generating nitrogen ions from a nitrogen containing gas;

exposing the first portion of the tungsten via to the nitrogen containing gas to form a nitrided surface over the unprotected portion of the first dielectric layer, the first dielectric pattern of the second dielectric layer and a tungsten nitride repair layer over the first portion of the first and second tungsten vias which repairs the damage on the first portion of the first and second tungsten vias forming a metal diffusion barrier liner, wherein the metal diffusion barrier liner forms a continuous liner over the tungsten nitride repair layers over the first and second tungsten vias, nitrided surface of the pattern of the second dielectric layer and the nitrided surface on the second unprotected portion of the first dielectric layer; and forming a metal wire layer, wherein the metal wire layer forms a continuous layer over the first and second tungsten vias and the second dielectric pattern which protects the first portion of the dielectric layer and wherein the metal wire layer is in contact with the metal diffusion layer.

9. The method of claim 8, wherein generating the nitrogen ions from the nitrogen containing gas comprises exposing the nitrogen containing gas to an energy source effective to generate the nitrogen ions from the nitrogen containing gas.

10. The method of claim 9, wherein the energy source is a plasma energy source.

11. The method of claim 9, wherein the energy source is thermal energy source.

12. The method of claim 8, wherein the metal diffusion barrier liner is disposed over the tungsten nitride layer and reacts with the underlying nitride layers to form a metal nitride.

13. The method of claim 8, wherein the lower layer is a device layer of an integrated circuit device.

* * * * *